(12) United States Patent
Matsumoto (10) Patent No.: US 10,674,596 B2
(45) Date of Patent: Jun. 2, 2020

(54) ELECTRONIC COMPONENT, ELECTRONIC COMPONENT MANUFACTURING METHOD, AND MECHANICAL COMPONENT

(71) Applicant: NEC CORPORATION, Tokyo (JP)

(72) Inventor: Yuki Matsumoto, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 16/237,299

(22) Filed: Dec. 31, 2018

(65) Prior Publication Data
US 2019/0230780 A1 Jul. 25, 2019

(30) Foreign Application Priority Data
Jan. 25, 2018 (JP) ................................ 2018-010202

(51) Int. Cl.
H05K 1/02 (2006.01)
H05K 3/34 (2006.01)
H05K 1/18 (2006.01)

(52) U.S. Cl.
CPC ......... *H05K 1/0209* (2013.01); *H05K 1/0203* (2013.01); *H05K 1/0212* (2013.01); *H05K 1/181* (2013.01); *H05K 3/3431* (2013.01); *H05K 3/3494* (2013.01); *H05K 2201/066* (2013.01); *H05K 2201/10371* (2013.01); *H05K 2201/10409* (2013.01); *H05K 2201/10522* (2013.01)

(58) Field of Classification Search
CPC ... H05K 7/2039–20518; H05K 1/0203; H05K 1/0209; H05K 1/181; H05K 1/0212; H05K 3/3494; H05K 3/3431; H05K 2201/10522; H05K 2201/10409; H05K 2201/066; H05K 2201/10371

USPC .................................................. 361/800, 818
See application file for complete search history.

(56) References Cited

U.S. PATENT DOCUMENTS

| | | | |
|---|---|---|---|
| 7,746,650 B2 * | 6/2010 | Hellinger | H01L 23/3672 165/185 |
| 8,093,714 B2 * | 1/2012 | Bonthron | H01L 23/04 257/704 |
| 9,439,333 B2 * | 9/2016 | Daughtry, Jr. | H05K 9/0028 |
| 9,735,826 B2 * | 8/2017 | Sohn | H04B 1/3888 |
| 10,091,868 B2 * | 10/2018 | Nakayama | B32B 7/02 |

(Continued)

FOREIGN PATENT DOCUMENTS

| | | |
|---|---|---|
| JP | 9-293808 A | 11/1997 |
| JP | 2000-91457 A | 3/2000 |
| JP | 2000174196 A * | 6/2000 |

(Continued)

OTHER PUBLICATIONS

Communication dated Jan. 15, 2019 from Japanese Patent Office in counterpart JP Application No. 2018-010202.

(Continued)

*Primary Examiner* — Zachary Pape
(74) *Attorney, Agent, or Firm* — Sughrue Mion, PLLC (57) ABSTRACT

An electronic component includes a board on which a heat generating member is mounted, and a mechanical component that covers the upper side of the board and has an opening at a position corresponding to the heat generating member. The mechanical component has a connection part dissipating heat of the heat generating member to the mechanical component via the board, in the vicinity of the opening.

10 Claims, 6 Drawing Sheets

(56) References Cited

U.S. PATENT DOCUMENTS

| | | | |
|---|---|---|---|
| 10,251,257 B2* | 4/2019 | Lai | H05K 1/0203 |
| 2016/0278198 A1* | 9/2016 | Matsumoto | H05K 1/0203 |

FOREIGN PATENT DOCUMENTS

| | | | |
|---|---|---|---|
| JP | 2001-015976 A | 1/2001 | |
| JP | 2002-158318 A | 5/2002 | |
| JP | 2006-32492 A | 2/2006 | |
| JP | 2006-66594 A | 3/2006 | |
| JP | 2008-112921 A | 5/2008 | |
| JP | 2011-192668 A | 9/2011 | |
| JP | 2012-195452 A | 10/2012 | |
| WO | 2006/059556 A1 | 6/2006 | |
| WO | 2016/042739 A1 | 6/2016 | |

OTHER PUBLICATIONS

Communication dated Jun. 11, 2019, from the Japanese Patent Office in counterpart application No. 2018-010202.

* cited by examiner

1. PRINT SOLDER

2. MOUNT HEAT GENERATING MEMBER

3. MOUNT MECHANICAL COMPONENT

4. REFLOW

Fig.11

ELECTRONIC COMPONENT, ELECTRONIC COMPONENT MANUFACTURING METHOD, AND MECHANICAL COMPONENT

INCORPORATION BY REFERENCE

This application is based upon and claims the benefit of priority from Japanese patent application No. 2018-010202, filed on Jan. 25, 2018, the disclosure of which is incorporated herein in its entirety by reference.

TECHNICAL FIELD

The present invention relates to an electronic component, an electronic component manufacturing method, and a mechanical component.

BACKGROUND ART

It is known to, for the purpose of reinforcement, cooling assistance or the like, cover a board provided with a heat generating component such as a surface mount device and an electronic component with a structural component such as a covering member and a cover.

For example, Patent Document 1 describes an electronic component which has a wiring board, a surface mount device mounted on the wiring board, and a covering member covering the surface mount device. According to Patent Document 1, the covering member has a ceiling part formed by a ceramic member like a flat plate, and a leg part formed by a columnar member having a height at least as high as the surface mount device. Moreover, according to Patent Document 1, the surface mount device and the leg part of the covering member are mounted on the board with solder.

Further, as a similar technique, for example, Patent Document 2 describes a wiring board which has an element and a shied cap joined so as to cover at least part of an element mounting part. According to Patent Document 2, for example, solder mounting of the element and solder bonding of the shield cap are done simultaneously in one solder reflow.

Further, a related technique is described in Patent Document 3, for example. Patent Document 3 describes an electronic circuit unit soldered with the leg part of a metal cover inserted in a through hole provided on a board. According to Patent Document 3, a solder land is provided at the corner of the board, and a reinforcing land is provided on the lower surface of the board. At least one of the solder land and the reinforcing land has a cut-out part for removing air.

Further, a related technique is described in Patent Document 4, for example. Patent Document 4 describes an electronic circuit unit which has an insulating board with an electronic component mounted and a metal cover for covering the electronic component. According to Patent Document 4, the insulating board is provided with a cover attachment hole formed through the insulating board and having an electrode on the inner wall. Moreover, the cover includes a cover terminal extending to the end edge and located in the cover attachment hole and fixed with solder. The cover terminal has, at the tip end side, a grip part for holding the solder filled between the front-end side and the end edge.
Patent Document 1: WO2006/059556
Patent Document 2: Japanese Unexamined Patent Application Publication No. JP-A 2001-015976
Patent Document 3: Japanese Unexamined Patent Application Publication No. JP-A 2011-192668
Patent Document 4: Japanese Unexamined Patent Application Publication No. JP-A 2008-112921

The structural components as described in Patent Documents 1 to 4 may have a role as a cooling aid that dissipates heat generated from a heat generating component through a board (an insulating board, a wiring board). However, according to the techniques described in Patent Documents 1 to 4, the structural component is in contact with the board only at a leg part provided at the corner of the structural component. For this reason, a place where heat is transferred from the board to the structural component is limited, which results in a problem that increase of heat dissipation performance is difficult.

Thus, there has been a problem that increase of heat dissipation performance of a structural component mounted on a board is difficult.

SUMMARY OF THE INVENTION

Accordingly, an object of the present invention is to provide an electronic component, an electronic component manufacturing method and a structural component that solve the problem that increase of heat dissipation performance of a structural component mounted on a board is difficult.

In order to achieve the object, an electronic component as an aspect of the present invention includes: a board on which a heat generating member is mounted; and a mechanical component that covers an upper side of the board and has an opening at a position corresponding to the heat generating member. The mechanical component has a connection part dissipating heat of the heat generating member to the mechanical component via the board, in vicinity of the opening.

Further, an electronic component manufacturing method as another aspect of the present invention includes: placing, on a board on which a heat generating member is mounted, a mechanical component that covers an upper side of the board, has an opening at a position corresponding to the heat generating member, and has a connection part dissipating heat of the heat generating member to the mechanical component via the board, in vicinity of the opening; and connecting the board and the mechanical component by using a thermal conductive member conducting heat.

Further, a mechanical component as another aspect of the present invention is a mechanical component covering an upper side of a board. The mechanical component has: an opening at a position corresponding to a heat generating member mounted on the board; and, a connection part dissipating heat of the heat generating member to the mechanical component via the board, in vicinity of the opening.

With the configurations as described above, the present invention can provide an electronic component, an electronic component manufacturing method and a structural component that solve the problem that increase of heat dissipation performance of a structural component mounted on a board is difficult.

EXAMPLE EMBODIMENT

[First Example Embodiment]

Figure 1:
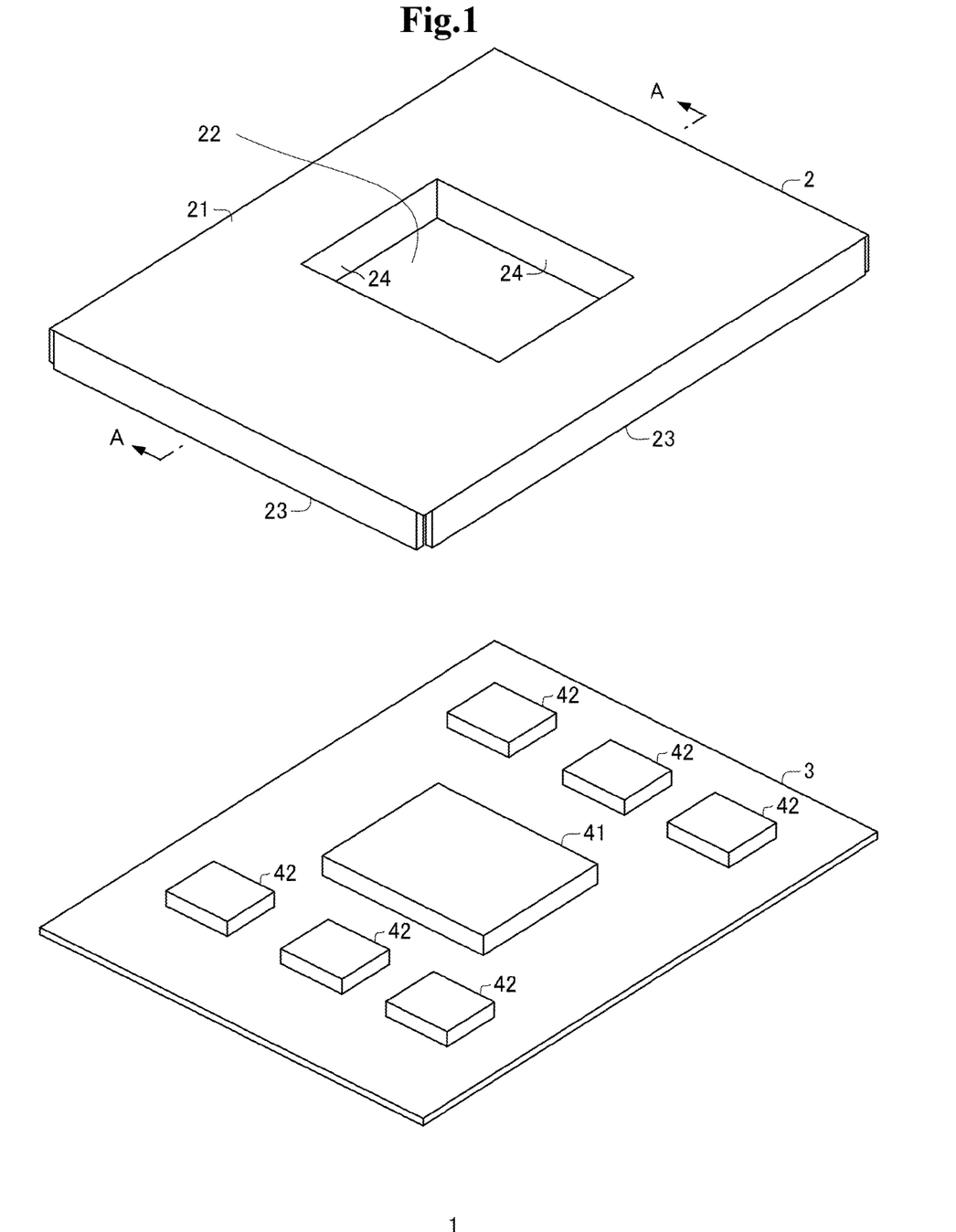
FIG. 1 is a perspective view showing an example of a configuration of an electronic component according to a first example embodiment of the present invention.
Figure 2:
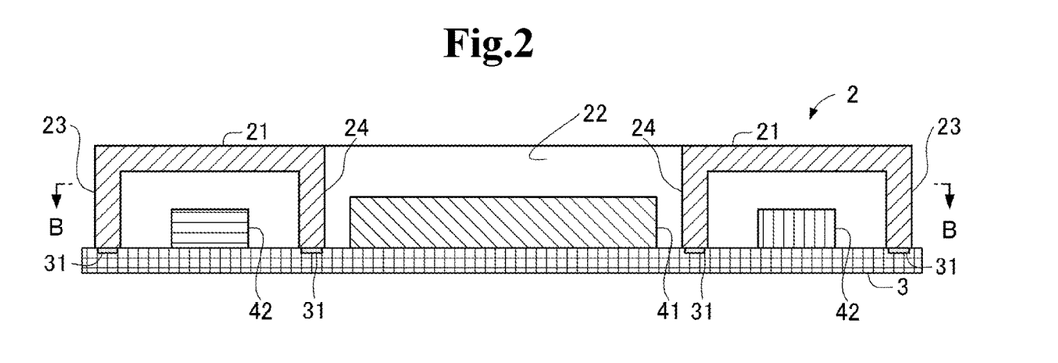
FIG. 2 is a cross-section view taken on line A-A in a state where a mechanical component is mounted on a board.
Figure 3:
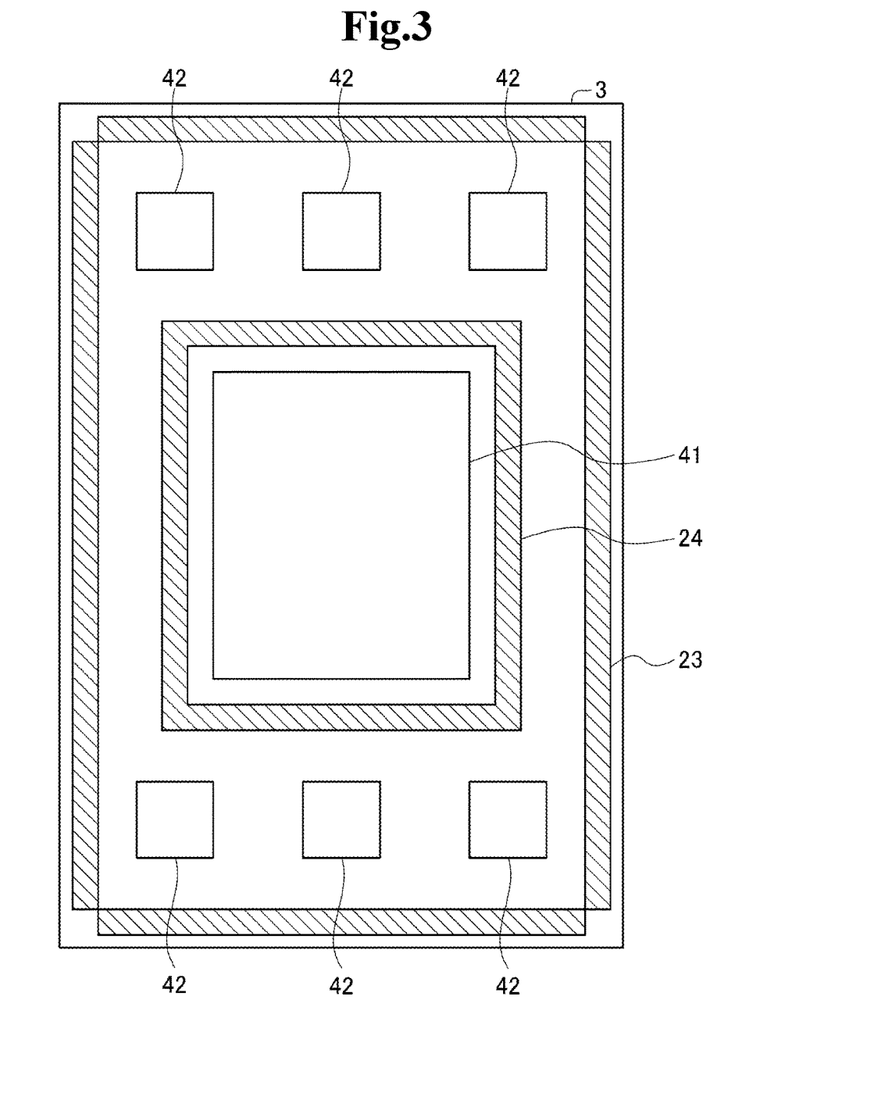
FIG. 3 is a cross-section view taken on line B-B showing an example of shapes of a leg part and a connection part.
Figure 4:
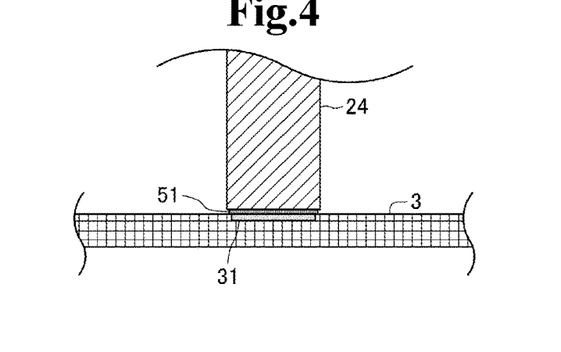
FIG. 4 is a cross-section view showing an example of a method for connecting the connection part and the board.
Figure 5:
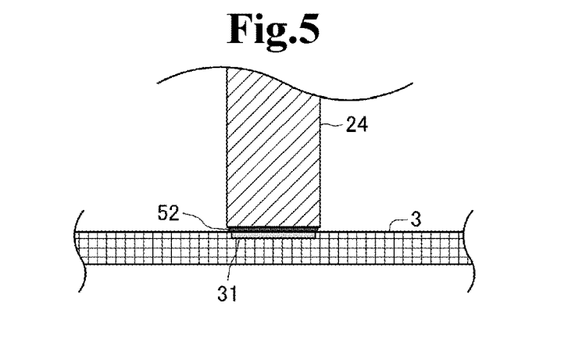
FIG. 5 is a cross-section view showing another example of the method for connecting the connection part and the board.
Figure 6:
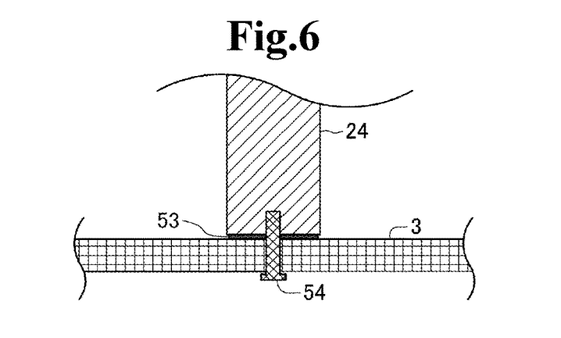
FIG. 6 is a cross-section view showing another example of the method for connecting the connection part and the board.
Figure 7:
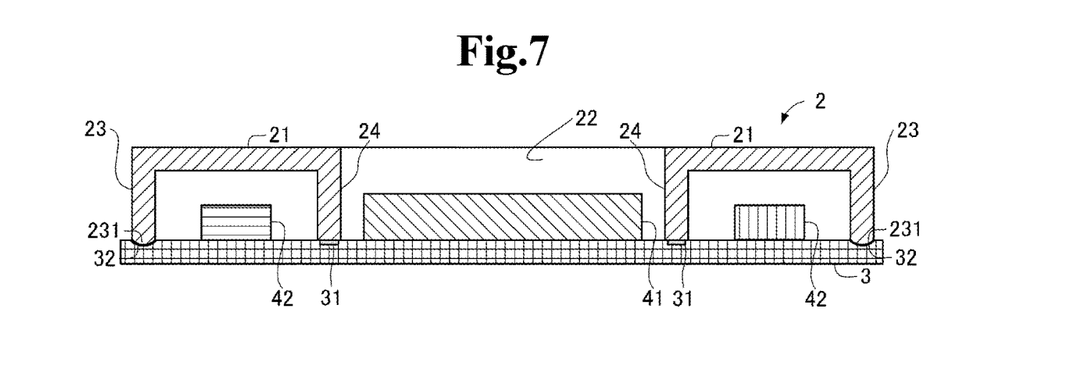
FIG. 7 is a cross-section view showing an example of other shapes of the leg part and the board.
Figure 8:
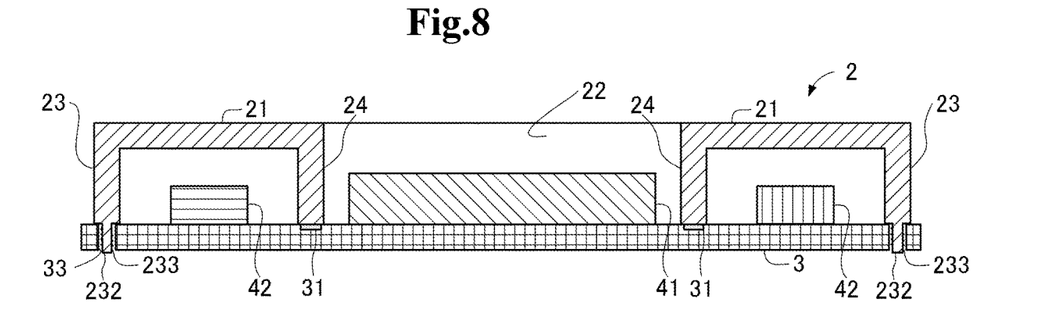
FIG. 8 is a cross-section view showing an example of another method for connecting the connection part and the board.
Figure 9:
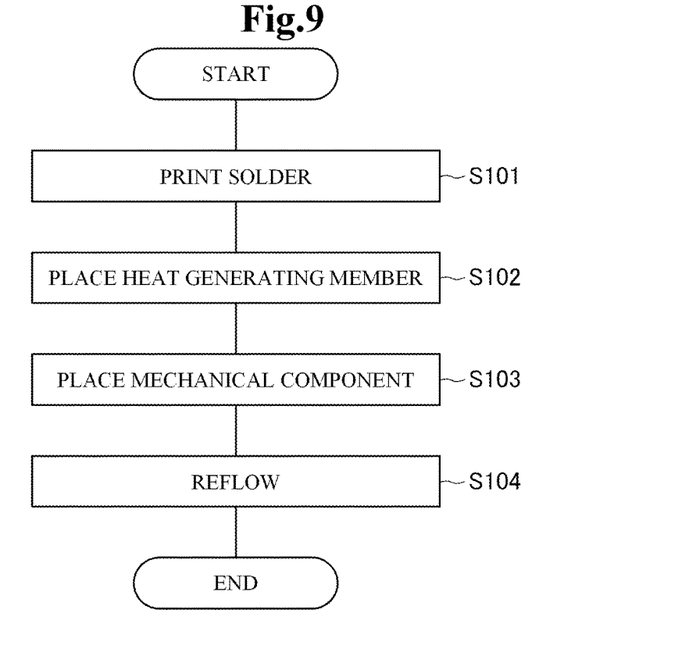
FIG. 9 is a flowchart showing an example of a flow when the electronic component is manufactured.
Figure 10:
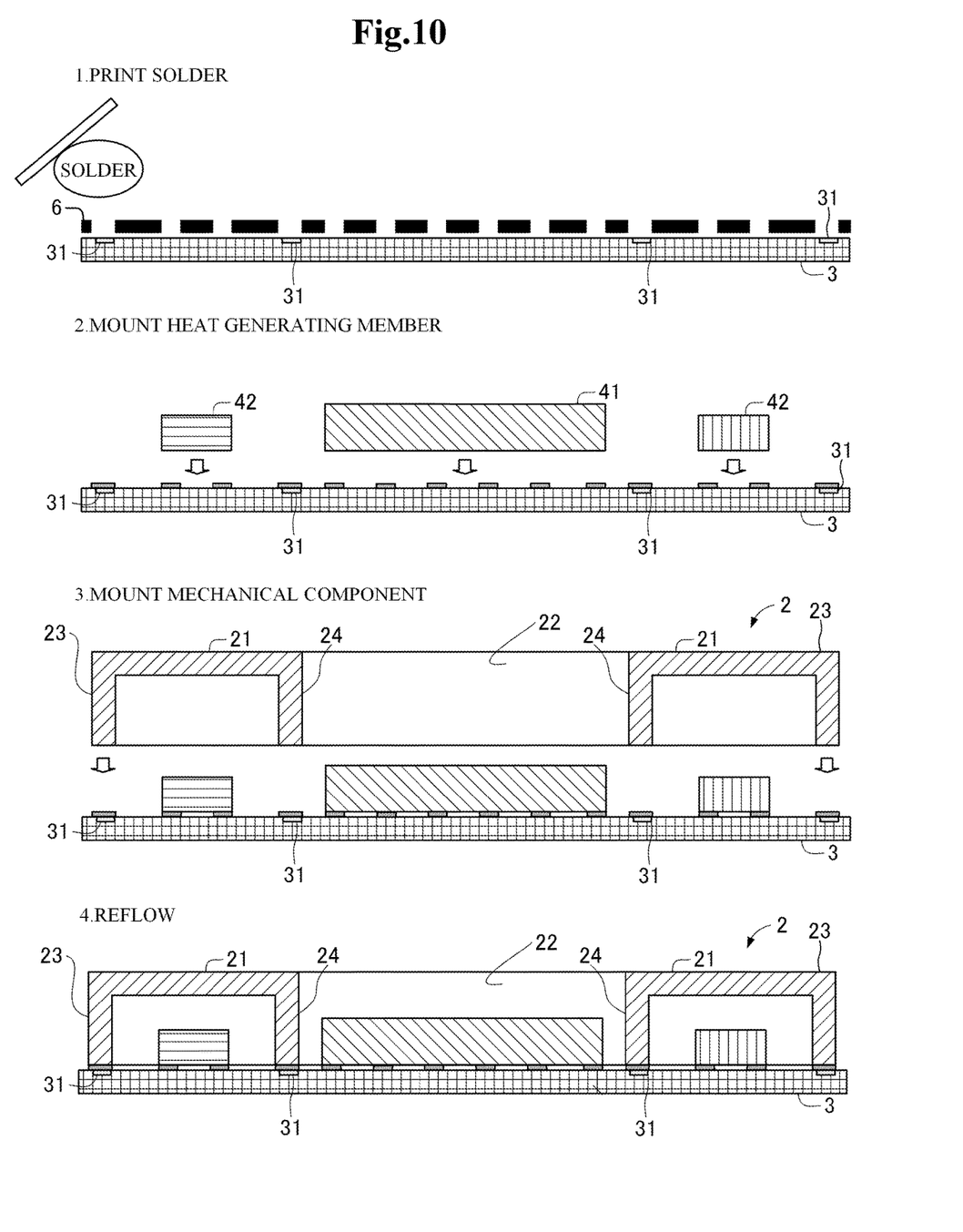
FIG. 10 is a view showing an example of the flow when the electronic component is manufactured.

A first example embodiment of the present invention will be described with reference to FIGS. 1 to 10. FIG. 1 is a perspective view showing an example of a configuration of an electronic component 1. FIG. 2 is a cross-section view taken on line A-A in a state where a mechanical component 2 is mounted on a board 3. FIG. 3 is a cross-section view taken on line B-B showing an example of shapes of a leg part 23 and a connection part 24. FIGS. 4 to 6 are cross-section views showing examples of a method for connecting the connection part 24 and the board 3. FIGS. 7 and 8 are cross-section views showing examples of other shapes of the leg part 23 and the board 3. FIGS. 9 and 10 are views showing an example of a flow when the electronic component is manufactured.

In the first example embodiment, the board 3 on which a heat generating member is mounted and the mechanical component 2 which is connected to the board 3 and reinforces the board 3 will be described. As will be described later, the mechanical component 2 has the connection part 24, in addition to the leg part 23 used in connection to the board 3. The connection part 24 is provided at a position corresponding to the periphery of a high-heat generating component 41 that is a component expected to generate especially high heat among the heat generating members. The connection part 24 is connected to the board 3 around the high-heat generating component 41. In other words, the mechanical component 2 described in this example embodiment has the leg part 23 and also has the connection part 24 connected to the board 3 around the high-heat generating component 41.

FIG. 1 is a perspective view showing an example of an entire configuration of the electronic component 1. With reference to FIG. 1, the electronic component 1 has the mechanical component 2 and the board 3. On the board 3, one heat generating member or a plurality of heat generating members are mounted. For example, in the case shown in FIG. 1, one high-heat generating component 41 and six heat generating components 42 are mounted on the board 3.

The number of the heat generating members (the high-heat generating component 41, the heat generating component 42) mounted on the board 3 is not limited to that shown in FIG. 1. On the board 3, one heat generating member or any number of heat generating members can be mounted. Moreover, FIG. 1 illustrates a case where the heat generating members are mounted on one surface of the board 3. However, the heat generating members may be mounted on both the surfaces of the board 3, for example. Moreover, in the case of mounting the heat generating members on both the surfaces of the board 3, the structural component 2 may also be connected to the rear face of the board 3. In other words, the electronic component 1 may include two mechanical components and one board 3.

The mechanical component 2 is formed by, for example, a member which has favorable heat dissipation efficiency and stiffness, such as copper and aluminum. The mechanical component 2 covers the upper side (or the lower side) of the board 3 in a state of being connected to the board 3. With reference to FIG. 1, the mechanical component 2 has a plate-like flat plate member 21 with an opening 22 formed, the leg part 23 formed at the end of the flat plate member 21, and the connection part 24 formed near the opening 22.

The opening 22 is a through hole formed at a position corresponding to the high-heat generating component 41 on the flat plate member 21. In other words, the opening 22 is formed at a position corresponding to the position of the high-heat generating component 41 mounted on the board 3 when the mechanical component 2 is connected to the board 3.

FIG. 2 is a cross-section view taken on line A-A in a state where the mechanical component 2 is connected to the board 3. With reference to FIG. 2, the flat plate member 21 is provided with the opening 22, and the high-heat generating component 41 is thereby exposed outside when the mechanical component 2 is connected to the board 3. Consequently, for example, it is possible to, in a state where the mechanical component 2 is connected to the board 3, make a cooling device such as a heat sink, which is not shown in the drawings, in contact with the high-heat generating component 41 directly (or via thermal grease or the like). On the other hand, an opening is not formed at a position corresponding to the heat generating component 42. Therefore, as shown in FIG. 2, the heat generating component 42 is not exposed outside when the mechanical component 2 is connected to the board 3.

The leg part 23 is used in connection of the mechanical component 2 and the board 3. As shown in FIG. 2, the leg part 23 is formed at the end of the flat plate member 21. For example, the leg part 23 is formed by bending 90 degrees (may be any angle other than illustrated) a part formed by extending the flat plate member 21.

FIG. 3 is a cross-section view taken on line B-B showing a state where the mechanical component 2 is connected to the board 3. FIG. 3 shows an example of shapes of the leg part 23 and the connection part 24. With reference to FIG. 3, the leg part 23 is formed so as to substantially surround the high-heat generating component 41 and the heat generating components 42.

The leg part 23 and the board 3 are connected by using solder, for example. Connecting the leg part 23 to the board 3 by using solder may be done at the same timing as soldering (reflowing) the heat generating member such as the high-heat generating component 41 and the heat generating components 42 to the board 3, or may be done at a different timing. Meanwhile, the leg part 23 and the board 3 may be connected by a method other than using solder, for example, by using a screw, an adhesive, or the like.

The connection part 24 is a part formed on the mechanical component 2 in order to increase the performance of dissipating heat from the board 3. The connection part 24 is formed near the opening 22. For example, the connection part 24 is formed by bending 90 degrees (may be any angle other than illustrated) part of the flat plate member 21 in the same direction as the leg part 23.

As shown in FIG. 2, the length of the connection part 24 is almost the same as the length of the leg part 23. Therefore, it is possible to connect the leg part 23 to the board 3 and also connect the connection part 24 to the board 3. Thus, the connection part 24 is connected to the board 3 in the vicinity of the opening 22. In other words, the connection part 24 is connected to the board 3 in the vicinity of the high-heat generating component 41 in a state where the leg part 23 is connected to the board 3.

With reference to FIG. 3, the connection part 24 is formed so as to surround the high-heat generating component 41. In FIG. 3, the connection part 24 entirely surrounds the high-heat generating component 41. However, the connection part 24 may not entirely surround the high-heat generating component 41. For example, a component such as a signal line is mounted on the board 3. The connection part 24 may be formed, for example, so as to surround avoiding a place where a component such as a signal line is mounted.

The connection part 24 may not be formed necessarily so as to surround the high-heat generating component 41, as far as formed in the vicinity of the high-heat generating component 41. For example, the connection part 24 may be formed in a plurality of places around the high-heat generating component 41.

The connection part 24 and the board 3 can be connected by various methods. FIGS. 4 to 6 are cross-section views showing examples of a method for connecting the connection part 24 and the board 3. With reference to FIGS. 4, 5 and 6, the examples of the method for connecting the connection part 24 and the board 3 will be described below.

With reference to FIG. 4, the connection part 24 and the board 3 can be connected, for example, by using solder 51. In the case of connecting the connection part 24 and the board 3 by using the solder 51, it is possible to, for example, connect at the same timing as connecting the leg part 23 and the board 3 by using solder.

Further, with reference to FIG. 5, the connection part 24 and the board 3 can be connected, for example, by using an adhesive 52 with enhanced thermal conductivity. The adhesive 52 is, for example, an adhesive with high thermal conductivity. Thermal conductivity is enhanced by, for example, inclusion of silver or the like in the adhesive 52.

Further, with reference to FIG. 6, the connection part 24 and the board 3 can be connected, for example, by using a screw 54. As shown in FIG. 6, in the case of connecting the connection part 24 and the board 3 by using the screw 54, a member having good thermal conductivity, such as thermal grease 53, is applied between the connection part 24 and the board 3 in order to enhance thermal conductivity. Thus, the connection part 24 and the board 3 may be connected by using the thermal grease 53 and the screw 54.

As described above, the connection part 24 and the board 3 are connected by a method which enhances thermal conductivity. In other words, a connection place between the connection part 24 and the board 3 has a thermal conductive member that conducts heat, such as the solder 51, the adhesive 52, and the thermal grease 53.

The board 3 is a plate-like board such as a glass epoxy board (may be any composition other than illustrated). The board 3 has, for example, a substantially rectangular shape in plan view.

On the board 3, the heat generating members such as the high-heat generating component 41 and the heat generating components 42 are mounted. As described above, in this example embodiment, the number of the heat generating members mounted on the board 3 is not specifically limited. Moreover, as shown in FIG. 2, a copper pad 31 is formed at a part of the board 3 connected to the mechanical component 2.

The heat generating member is mounted on the board 3, for example, by using solder. The heat generating member can include the high-heat generating component 41 and the heat generating components 42.

The high-heat generating component 41 is a component expected to generate much heat among the heat generating members. The high-heat generating component 41 is, for example, a CPU (Central Processing Unit), a GPU (Graphics Processing Unit), a FPGA (field-programmable gate array), and a memory chip. The high-heat generating component 41 may be other than illustrated above.

The heat generating component 42 is a component other than the high-heat generating component 41 among the heat generating members. The heat generating component 42 is a transistor, a resistor, a capacitor, and a diode, for example. The heat generating component 42 may be other than illustrated above.

The above is an example of the configuration of the electronic component 1.

Connection between the leg part and the board 3 and connection between the connection part 24 and the board 3 may be done by using the same solder as the solder used for connection between the heat generating member and the board 3, or may be done by using a different solder. For example, connection between the leg part 23 and the board 3 or connection between the connection part 24 and the board 3 may be done by using solder whose melting point is lower than that of the solder used for connection between the heat generating member and the board 3. According to the above-described configuration, by reflowing in a reflow furnace in which the temperature is controlled so as to be lower than the melting point of the solder used when connecting the heat generating member and the board 3, it is possible to, at the time of repair or the like, disassemble the mechanism component 2 and the board 3 while maintaining connection of the heat generating member and the board 3.

Further, for example, as shown in FIG. 7, a concave part 32 may be formed on a face of the board 3 contacting the leg part 23, and a convex part 231 corresponding to the shape of the concave part 32 may be formed at the lower end of the leg part 23. By thus forming a curved contact face, it is possible to securely connect the mechanical component 2 to the board 3 even if the board 3 warps.

Copper is plated on the concave part 32, for example. Alternatively, the connection part 24 and the board 3 may be provided with a convex part and a concave part on the contact faces. However, from the viewpoint of dealing with warpage, it is better to provide the leg part 23 and the board 3 with a convex part and a concave part on the contact faces as described above, rather than providing the connection part 24 and the board 3 with a convex part and a concave part on the contact faces.

Further, the mechanical component 2 and the board 3 may be connected, for example, by using a through hole. For example, as shown in FIG. 8, a through hole 33 is formed in a predetermined place of the board 3. Moreover, an insertion part 232 inserted into the through hole 33 is provided at the lower end of the leg part 23. Then, by soldering with the insertion part 232 inserted in the through hole 33, the mechanical component 2 and the board 3 are connected.

Further, in the case of connecting the mechanical component 2 and the board 3 by using a through hole, for example, an electric heating wire 233 may be provided around the insertion part 232. By providing the electric heating wire 233 around the insertion part 232, it is possible to easily disassemble the mechanical component 2 and the board 3 by flowing an electric current through the electric heating wire 233 and heating at the time of disassembly.

Further, in this example embodiment, the mechanical component 2 has the opening 22 at a position corresponding to the high-heat generating component 41. However, the mechanical component 2 may also have an opening, for example, at a position corresponding to the heat generating component 42. Moreover, in the case of mounting a plurality of heat generating components 42 on the board 3, the mechanical component 2 can have an opening at a position corresponding to at least one of the heat generating components 42 mounted on the board 3.

Next, with reference to FIGS. 9 and 10, an example of a flow of manufacturing the electronic component 1 will be described. FIG. 9 is a flowchart showing an example of a flow at the time of manufacturing the electronic component 1. FIG. 10 is a view showing an example of the flow at the time of manufacturing the electronic component 1.

With reference to FIG. 9, solder is printed on the board 3 (step S101). For example, as shown in FIG. 10, solder is printed at a position corresponding to a place to locate the mechanical component 2 or the heat generating member on the board 3. For solder printing, for example, a metal mask 6 having a through hole at a position corresponding to the above-described place is set on the board 3.

Subsequently, the heat generating members such as the high-heat generating component 41 and the heat generating components 42 are set on the board 3 (step S102). Moreover, the mechanical component 2 is set on the board 3 (step S103). As shown in FIG. 10, the heat generating members and the mechanical component 2 are set at positions corresponding to the respective connection places (that is, the positions on which solder is printed).

By reflowing, solder connection is completed (step S104).

The electronic component 1 can be manufactured in the above-described flow, for example. Meanwhile, the flow shown in FIG. 9 is merely an example. For example, in the case of connecting the mechanical component 2 by a method other than soldering, the heat generating members and the mechanical component 2 may not be connected simultaneously.

As described above, the mechanical component 2 in this example embodiment has the connection part 24 formed in the vicinity of the opening 22. With such a configuration, the mechanical component 2 is connected to the board 3 by using the connection part 24 in the vicinity of the high-heat generating component 41. Consequently, the mechanical component 2 can efficiently dissipate heat generated from the high-heat generating component 41. As a result, it is possible to increase the heat dissipation performance of the mechanical component 2 that is a structural component provided on the board 3.

[Second Example Embodiment]

Next, with reference to FIG. 11, a second example embodiment of the present invention will be described. In the second example embodiment, the outline of a configuration of an electronic component 7 will be described.

Figure 11:
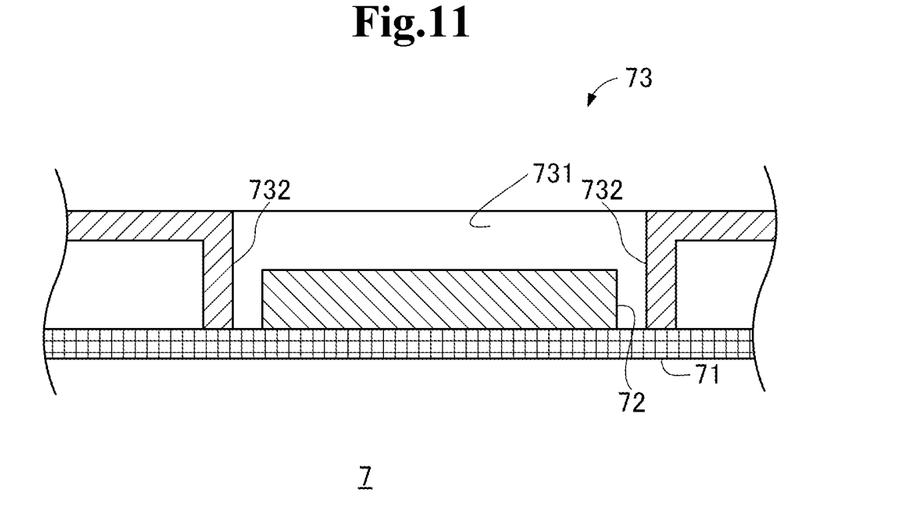
FIG. 11 is a cross-section view showing an example of a configuration of an electronic component according to a second example embodiment of the present invention.

With reference to FIG. 11, the electronic component 7 has a board 71, a heat generating member 72, and a mechanical component 73.

On the board 71, the heat generating member 72 is mounted.

The mechanical component 73 covers the upper side of the board 71 and has an opening 731 at a position corresponding to the heat generating member 72. Moreover, the mechanical component 73 has a connection part 732 that dissipates heat of the heat generating member 72 to the mechanical component 73 via the board 71 in the vicinity of the opening 731.

Thus, the mechanical component 73 in this example embodiment has the connection part 732 in the vicinity of the opening 731. With such a configuration, the mechanical component 73 can connect to the board 71 in the vicinity of the heat generating member 72. Consequently, the mechanical component 73 can more efficiently dissipate heat generated from the heat generating member 72. As a result, it is possible to increase the heat dissipation performance of the mechanical component 73 that is a structural component provided on the board 71.

Further, a method for manufacturing the electronic component 7 executed when manufacturing the electronic component 7 described above is a method including: on the board 71 on which the heat generating member 72 is mounted, placing the mechanical component 73 covering the upper side of the board 71, having the opening 731 at a position corresponding to the heat generating member 72, and having the connection part 732 dissipating heat of the heat generating member 72 to the mechanical component 73 via the board 71; and connecting the board 71 and the mechanical component 73 by using a thermal conductive member conducting heat.

The invention of the method for manufacturing the electronic component 7, having the above-described configuration, also has the same effect as the electronic component 7, and therefore, can achieve the above-described object of the present invention. Moreover, the mechanical component 73 also has the same effect, and therefore, can achieve the above-described object of the present invention.

<Supplementary Notes>

The whole or part of the example embodiments disclosed above can be described as the following supplementary notes. The outline of an electronic component and so on according to the present invention will be described below. However, the present invention is not limited to the following configurations.

<Supplementary Note 1>

An electronic component comprising:

a board on which a heat generating member is mounted; and a mechanical component that covers an upper side of the board and has an opening at a position corresponding to the heat generating member, wherein the mechanical component has a connection part dissipating heat of the heat generating member to the mechanical component via the board, in vicinity of the opening.

(Supplementary Note 2)

The electronic component according to Supplementary Note 1, wherein the connection part is connected to the board and has a thermal conductive member conducting heat, at a connection place between the connection part and the board.

(Supplementary Note 3)

The electronic component according to Supplementary Note 1 or 2, wherein the connection part is connected to the board by soldering.

(Supplementary Note 4)

The electronic component according to Supplementary Note 1 or 2, wherein the connection part is connected to the board by an adhesive containing silver.

(Supplementary Note 5)

The electronic component according to Supplementary Note 1 or 2, wherein:

the connection part is connected to the board by a screw; and thermal grease conducting heat is applied to a connection place between the connection part and the board.

(Supplementary Note 6)

The electronic component according to any of Supplementary Notes 1 to 5, wherein:

the board has a plurality of heat generating members; and the mechanical component has an opening at a position corresponding to a high-heat generating component generating a large amount of heat among the plurality of heat generating components.

(Supplementary Note 7)

The electronic component according to Supplementary Note 6, wherein the connection part is formed so as to surround substantially a periphery of the high-heat generating component.

(Supplementary Note 8)

The electronic component according to any of Supplementary Notes 1 to 7, wherein:

the mechanical component has a leg part contacting the board, at an end of the mechanical component; and the leg part is connected to the board by soldering.

(Supplementary Note 9)

The electronic component according to Supplementary Note 8, wherein:

a concave part is formed at a position corresponding to the leg part on the board; and a convex part corresponding to the concave part is formed on the leg part.

(Supplementary Note 10)

The electronic component according to Supplementary Note 8, wherein:

a through hole is formed at an end of the board;

the leg part is soldered with part of the leg part is inserted in the through hole; and an electric heating wire is formed on part of the leg part inserted in the through hole.

(Supplementary Note 11)

The electronic component according to any of Supplementary Notes 8 to 10, wherein the leg part is connected to the board with solder having a lower melting point than solder for connecting the heat generating member to the board.

(Supplementary Note 12)

An electronic component manufacturing method comprising:

placing, on a board on which a heat generating member is mounted, a mechanical component that covers an upper side of the board, has an opening at a position corresponding to the heat generating member, and has a connection part dissipating heat of the heat generating member to the mechanical component via the board, in vicinity of the opening; and connecting the board and the mechanical component by using a thermal conductive member conducting heat.

(Supplementary Note 13)

A mechanical component covering an upper side of a board, the mechanical component having:

an opening at a position corresponding to a heat generating member mounted on the board; and, a connection part dissipating heat of the heat generating member to the mechanical component via the board, in vicinity of the opening.

Although the present invention has been described above with reference to the example embodiments, the present invention is not limited to the example embodiments. The configurations and details of the present invention can be changed in various manners that can be understood by one skilled in the art within the scope of the present invention.

DESCRIPTION OF REFERENCE NUMERALS 1 electronic component
2 mechanical component
21 flat plate member
22 opening
23 leg part
231 convex part
24 connection part
3 board
31 copper pad
32 concave part
41 high-heat generating component
42 heat generating component
51 solder
52 adhesive
53 thermal grease
54 screw
6 metal mask
7 electronic component
71 board
72 heat generating member
73 mechanical component
731 opening
732 connection part

The invention claimed is:

1. An electronic component comprising:

a board on which a heat generating member is mounted; and a mechanical component that covers an upper side of the board and has an opening at a position corresponding to the heat generating member, wherein the mechanical component has a connection part dissipating heat of the heat generating member to the mechanical component via the board, in vicinity of the opening, the mechanical component has a leg part contacting the board, at an end of the mechanical component, the leg part is connected to the board by soldering, through hole is formed at an end of the board, the leg part is soldered with part of the leg part inserted in the through hole; and an electric heating wire is formed on part of the leg part inserted in the through hole.

2. The electronic component according to claim 1, wherein the connection part is connected to the board and has a thermal conductive member conducting heat, at a connection place between the connection part and the board.

3. The electronic component according to claim 1, wherein the connection part is connected to the board by soldering.

4. The electronic component according to claim 1, wherein the connection part is connected to the board by an adhesive containing silver.

5. The electronic component according to claim 1, wherein:
   the connection part is connected to the board by a screw; and
   thermal grease conducting heat is applied to a connection place between the connection part and the board.

6. The electronic component according to claim 1, wherein:
   the board has a plurality of heat generating members; and
   the opening is at a position corresponding to a high-heat generating component generating a large amount of heat among the plurality of heat generating components.

7. The electronic component according to claim 6, wherein the connection part is formed so as to surround substantially a periphery of the high-heat generating component.

8. The electronic component according to claim 1, wherein the leg part is connected to the board with solder having a lower melting point than solder for connecting the heat generating member to the board.

9. An electronic component manufacturing method comprising:
   placing, on a board on which a heat generating member is mounted, a mechanical component that covers an upper side of the board, has an opening at a position corresponding to the heat generating member, and has a connection part dissipating heat of the heat generating member to the mechanical component via the board, in vicinity of the opening, wherein the mechanical component has a leg part contacting the board, at an end of the mechanical component;
   connecting the board and the mechanical component by using a thermal conductive member conducting heat;
   connecting the leg part to the board by soldering;
   forming a through hole at an end of the board;
   soldering the leg part with part of the leg part inserted in the through hole; and
   forming an electric heating wire on part of the leg part inserted in the through hole.

10. A mechanical component covering an upper side of a board, the mechanical component having:
   an opening at a position corresponding to a heat generating member mounted on the board; and,
   a connection part dissipating heat of the heat generating member to the mechanical component via the board, in vicinity of the opening
   wherein the mechanical component has a leg part contacting the board, at an end of the mechanical component,
   the leg part is connected to the board by soldering,
   a through hole is formed at an end of the board,
   the leg part is soldered with part of the leg part inserted in the through hole; and
   an electric heating wire is formed on part of the leg part inserted in the through hole.

* * * * *

UNITED STATES PATENT AND TRADEMARK OFFICE
CERTIFICATE OF CORRECTION

PATENT NO. : 10,674,596 B2  
APPLICATION NO. : 16/237299  
DATED : June 2, 2020  
INVENTOR(S) : Yuki Matsumoto

Page 1 of 1

It is certified that error appears in the above-identified patent and that said Letters Patent is hereby corrected as shown below:

In the Claims

Column 10, Line 56; Claim 1, before "through", insert --a--

Signed and Sealed this  
Seventeenth Day of November, 2020

Andrei Iancu  
*Director of the United States Patent and Trademark Office*